United States Patent
Basu et al.

(10) Patent No.: US 9,698,046 B2
(45) Date of Patent: Jul. 4, 2017

(54) FABRICATION OF III-V-ON-INSULATOR PLATFORMS FOR SEMICONDUCTOR DEVICES

(71) Applicant: International Business Machines Corporation, Armonk, NY (US)

(72) Inventors: Anirban Basu, Lagrangeville, NY (US); Bahman Hekmatshoartabari, White Plains, NY (US); Ali Khakifirooz, Los Altos, CA (US); Davood Shahrjerdi, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/591,076

(22) Filed: Jan. 7, 2015

(65) Prior Publication Data

US 2016/0196972 A1    Jul. 7, 2016

(51) Int. Cl.
*H01L 21/70* (2006.01)
*H01L 21/762* (2006.01)
*H01L 21/02* (2006.01)
*H01L 29/06* (2006.01)
*H01L 21/265* (2006.01)
(Continued)

(52) U.S. Cl.
CPC .... *H01L 21/76254* (2013.01); *H01L 21/0251* (2013.01); *H01L 21/02381* (2013.01); *H01L 21/02463* (2013.01); *H01L 21/02505* (2013.01); *H01L 21/02546* (2013.01); *H01L 21/2654* (2013.01); *H01L 29/0649* (2013.01);
(Continued)

(58) Field of Classification Search
CPC ......... H01L 21/02505; H01L 21/02381; H01L 21/02463; H01L 21/76254
See application file for complete search history.

(56) References Cited

U.S. PATENT DOCUMENTS 5,728,623 A    3/1998   Mori
6,323,108 B1   11/2001  Kub et al.
(Continued)

OTHER PUBLICATIONS

Chen et al., "Effects of hydrogen implantation damage on the performance of InP/InGaAs/InP p-i-n photodiodes transferred on silicon", Applied Physics Letters, vol. 94, No. 1, 2009, 012101, 3 pages, published on line Jan. 6, 2009, © 2009 American Institute of Physics.
(Continued)

*Primary Examiner* — Marc Armand
*Assistant Examiner* — Sarah Salerno
(74) *Attorney, Agent, or Firm* — Steven F. McDaniel

(57) ABSTRACT

Embodiments of the present invention provide III-V-on-insulator (IIIVOI) platforms for semiconductor devices and methods for fabricating the same. According to one embodiment, compositionally-graded buffer layers of III-V alloy are grown on a silicon substrate, and a smart cut technique is used to cut and transfer one or more layers of III-V alloy to a silicon wafer having an insulator layer such as an oxide. One or more transferred layers of III-V alloy can be etched away to expose a desired transferred layer of III-V alloy, upon which a semi-insulating buffer layer and channel layer can be grown to yield IIIVOI platform on which semiconductor devices (e.g., planar and/or 3-dimensional FETs) can be fabricated.

13 Claims, 3 Drawing Sheets

(51) Int. Cl.
*H01L 29/66* (2006.01)
*H01L 29/20* (2006.01)

(52) U.S. Cl.
CPC .. *H01L 29/66522* (2013.01); *H01L 29/66795* (2013.01); *H01L 29/20* (2013.01)

(56) References Cited

U.S. PATENT DOCUMENTS

| | | | |
|---|---|---|---|
| 6,455,398 | B1 | 9/2002 | Fonstad, Jr. et al. |
| 7,611,974 | B2 | 11/2009 | Letertre |
| 7,968,911 | B2 | 6/2011 | Celler |
| 8,841,177 | B2 | 9/2014 | Chen et al. |
| 2004/0079408 | A1* | 4/2004 | Fetzer ............... H01L 31/184 136/262 |
| 2005/0184316 | A1* | 8/2005 | Kim ............... H01L 29/66795 257/213 |
| 2007/0138565 | A1* | 6/2007 | Datta ............... H01L 21/823807 257/369 |
| 2010/0163926 | A1* | 7/2010 | Hudait ............... H01L 29/1054 257/190 |
| 2013/0153964 | A1 | 6/2013 | Guo et al. |

OTHER PUBLICATIONS

Fang et al., "Strain engineering of epitaxially transferred, ultrathin layers of III-V semiconductor on insulator," Applied Physics Letters, vol. 98, No. 1, 2011, 012111, 3 pages, published on line Jan. 6, 2011, © 2011 American Institute of Physics.

Leite et al., "Wafer-Scale Strain Engineering of Ultrathin Semiconductor Crystalline Layers," Materials Views, Advanced Materials, vol. 23, Issue 33, Sep. 1, 2011, pp. 3801-3807, © 2011 Wiley-VCH Verlag GmbH & Co. KGaA, Weinheim, DOI: 10.1002/adma.201101309.

Lubyshev et al., "Integration of III-V and Si CMOS Devices by Molecular Beam Epitaxy", ECS Transactions, vol. 19, No. 5, 2009, pp. 295-308, 10.1149/1.3119554 © The Electrochemical Society.

Takagi et al., "III-V/Ge CMOS technologies on Si platform", 2010 Symposium on VLSI Technology Digest of Technical Papers, Jun. 15-17, 2010, pp. 147-148, © 2010 IEEE.

Basu et al., "Fabrication of III-V-on-Insulator Platforms for Semiconductor Devices", U.S. Appl. No. 15/083,652, filed Mar. 29, 2016, 15 pages.

IBM, "List of IBM Patents or Patent Applications Treated as Related", Appendix P, 2 pages, dated Mar. 30, 2016.

* cited by examiner

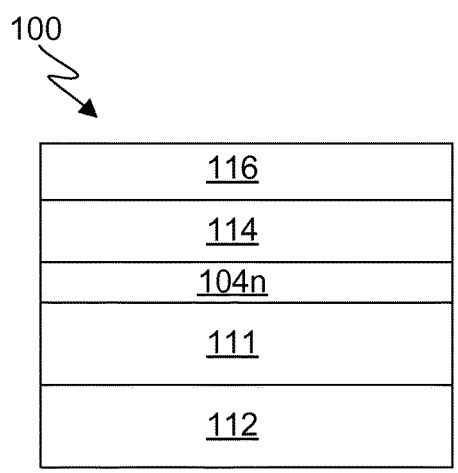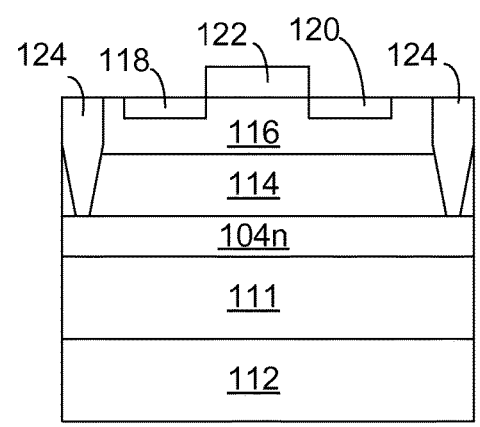
FIG. 1G
FIG. 1H

FABRICATION OF III-V-ON-INSULATOR PLATFORMS FOR SEMICONDUCTOR DEVICES

FIELD OF THE INVENTION

The present invention relates generally to the field of semiconductor devices, and more particularly to III-V-on-insulator (IIIVOI) platforms for semiconductor devices.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties.

Field-effect transistors (FETs), such as planar metal-oxide-semiconductor FETs (MOSFETs) and 3-dimensional FinFETs, are semiconductor devices. Silicon on insulator (SOI) platforms for FETs comprise layered silicon-insulator-silicon substrates on which FETs can be built, and such platforms can reduce parasitic device capacitance and improve performance.

III-V FET technologies use compound semiconductors selected from group 13 (old group III) and group 15 (old group V) of the period table of elements, such as ternary III-V semiconductor alloys comprised of indium gallium arsenide (InGaAs). III-V FETs on silicon platforms (e.g., such as CMOS platforms) can be difficult to fabricate on account of mismatched lattices of III-V materials and silicon, which can cause strain at the interfaces of such materials and result in defects in the semiconductor devices.

SUMMARY

According to one embodiment, a method for fabricating a IIIVOI platform for a semiconductor device is provided, the method comprising: growing a plurality of compositionally-graded III-V buffer layers on a first substrate; implanting ions into one or more of the plurality of compositionally-graded III-V buffer layers to create a cleave plane; bonding a second substrate to one or more of the plurality of compositionally-graded III-V buffer layers; separating, along the cleave plane, the second substrate and the one or more compositionally-graded III-V buffer layers bonded to the second substrate from the first substrate and one or more compositionally-graded III-V buffer layers bonded to the first substrate; growing a semi-insulating buffer layer on one of the one or more compositionally-graded III-V buffer layers bonded to the second substrate; and growing a channel layer on the semi-insulating buffer layer.

According to another embodiment, a IIIVOI platform for a semiconductor device is provided comprising: a substrate bonded to a compositionally-graded III-V buffer layer; a semi-insulating buffer layer grown on a compositionally-graded III-V buffer layer; and a channel layer grown on the semi-insulating buffer layer.

According to another embodiment, a IIIVOI platform for a semiconductor device is provided, comprising: a substrate bonded to a compositionally-graded III-V buffer layer, wherein the substrate comprises a silicon wafer having an oxide layer; and a channel layer grown on a compositionally-graded III-V buffer layer.

BRIEF DESCRIPTION OF THE DRAWINGS

The following detailed description, given by way of example and not intended to limit the disclosure solely thereto, will best be appreciated in conjunction with the accompanying drawings, in which:

FIGS. 1A through 1G depict phases of fabrication of a IIIVOI platform, in accordance with an embodiment of the present invention;

FIG. 1H depicts a phase of fabrication in which a planar FET is built on the IIIVOI platform of FIG. 1G, in accordance with an embodiment of the present invention;

DETAILED DESCRIPTION

Embodiments of the present invention provide efficient, cost-effective IIIVOI platforms for semiconductor devices and methods for fabricating the same. In one embodiment, compositionally-graded buffer layers of III-V alloy are grown on a silicon substrate, and a smart cut technique is used to cut and transfer layers of III-V alloy to a handle substrate (e.g., a silicon wafer having an insulator layer, such as an oxide). One or more transferred layers of III-V alloy can be etched away to expose a desired transferred layer of III-V alloy, upon which a semi-insulating buffer layer and channel layer can be grown to yield a IIIVOI platform on which semiconductor devices (e.g., planar and/or 3-dimensional FETs) can be fabricated.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such a feature, structure, or characteristic in connection with other embodiments whether or not explicitly described.

Figure 1A:
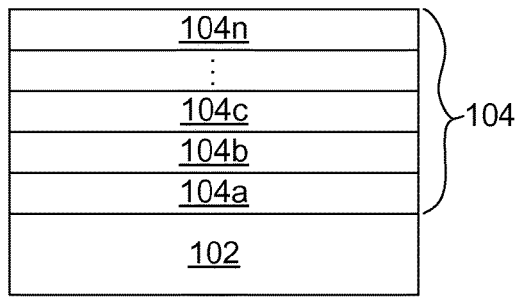

FIGS. 1A through 1G depict phases of fabrication of IIIVOI platform 100 (shown in FIG. 1G), in accordance with an embodiment of the present invention. As shown in FIG. 1A, compositionally-graded buffer layers 104 of III-V alloy are grown on substrate 102. In this embodiment, substrate 102 comprises silicon (e.g., single crystal silicon, polycrystalline silicon, silicon germanium, polycrystalline silicon germanium, etc.). In other embodiments, substrate 102 can comprise other materials and/or structure, such as an SOI substrate. Compositionally-graded buffer layers 104 comprise a plurality of different III-V layers 104a-n having different compositions and bond lengths that increase from III-V layer 104a (i.e., the III-V buffer layer closest to substrate 102) to III-V layer 104n (i.e., the III-V buffer layer furthest from substrate 102, and, correspondingly, nearest to the silicon substrate 112). Compositionally-graded buffer layers 104 can be grown using any suitable epitaxial growth and/or deposition techniques known in the art.

In this embodiment, III-V layer 104a is comprised of a III-V alloy having a bond length that is similar to the bond length of the silicon of substrate 102 to reduce strain at the interface between III-V layer 104a and substrate 102 on account of mismatched lattices. For example, silicon of substrate 102 may have a lattice constant of approximately 0.543 nm (at 300 K), and III-V layer 104a may be comprised of III-V alloys of GaAs (lattice constant of approximately 0.565 nm), InAlAs (lattice constant of approximately 0.57 nm), or GaP (lattice constant of approximately 0.545 nm).

In this embodiment, semi-insulating buffer layer 114 is ultimately grown upon III-V layer 104n, as discussed in greater detail later in this specification, so III-V layer 104n is comprised of a III-V alloy having a bond length that is similar to that of semi-insulating buffer layer 114 to reduce strain at the interface between III-V layer 104n and semi-insulating buffer layer 114. For example, where III-V layers 104a-n are comprised of ternary indium gallium arsenide (InGaAs) alloys, III-V layer 104a may be comprised of In(0.72)Ga(0.28)As (i.e., alloy comprised of 72% In and 28% Ga), and III-V layers 104b through 104n-1 may be compositionally graded by decreasing the In-content and increasing the Ga-content in each layer until reaching III-V layer 104n having a composition of In(0.53)Ga(0.47)As (i.e., alloy comprised of 53% In and 47% Ga). Furthermore, III-V layer 104n can be highly doped (i.e., n++ or p++) where a double-gated transistor structure is being built, such that III-V layer 104n can act as a conductor to control electrical behavior of channel layer 116, as discussed in greater detail later in this specification.

In other embodiments, any suitable III-V alloys can be used for compositionally-graded buffer layers 104, such as, for example, indium gallium antimonide (InGaSb), indium aluminum antimonide (InAlSb), and aluminum gallium nitride (AlGaN). Similarly, the number of compositionally-graded buffer layers 104 grown upon substrate 102, and the rate with which III-V layers 104a-n are compositionally graded moving from III-V layer 104a to III-V layer 104n, whether linearly or by some other design, can be adjusted based on a variety of considerations. Such considerations may include, for example, the difference in bond lengths between III-V layer 104a and III-V layer 104n, and the maximum acceptable lattice mismatch between each of III-V layers 104a-n, between III-V layer 104a and substrate 102, and between III-V layer 104n and semi-insulating buffer layer 114.

Figure 1B:
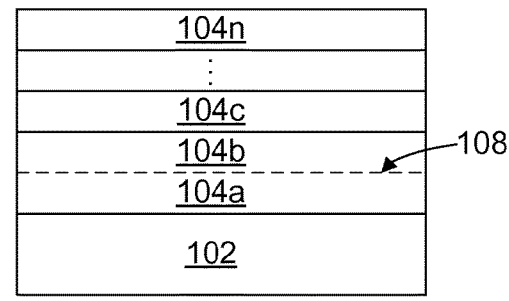

As shown in FIG. 1B, ions are implanted into compositionally-graded buffer layers 104 to create cleave plane 108. In this embodiment, a smart cut technique is used, and the ions may be hydrogen ions, helium ions, argon ions, and/or any other suitable ion species. While cleave plane 108 is depicted as being between III-V layer 104b and III-V layer 104a, cleave plane 108 need not be created at the interface between two of III-V layers 104a-n, and the depth of cleave plane 108 in compositionally-graded buffer layers 104 can be adjusted to any desirable level.

Figure 1C:
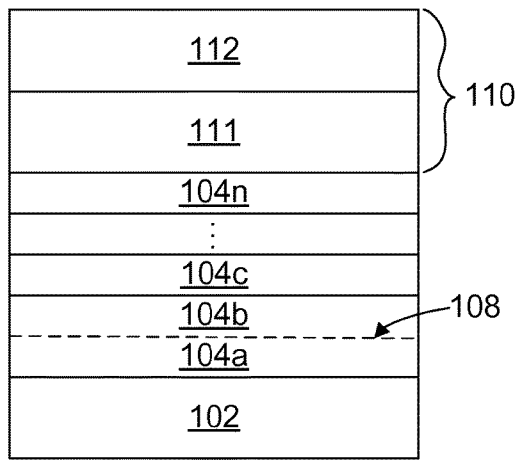

As shown in FIG. 1C, handle substrate 110 is bonded to III-V layer 104n. In this embodiment, handle substrate 110 comprises silicon substrate 112 having oxide layer 111, where a surface of oxide layer 111 is bonded to a surface of III-V layer 104n. In other embodiments, handle substrate 110 can comprise other materials and structures, such as, for example, back-end-of-line (BEOL) components.

Figure 1D:
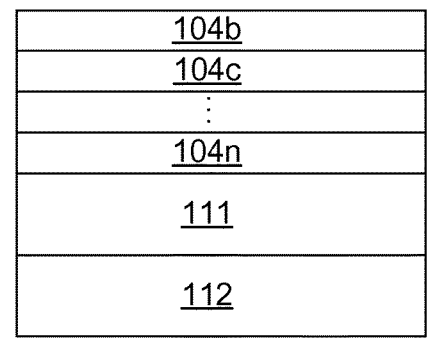

As shown in FIG. 1D, substrate 102 and one or more of compositionally-graded buffer layers 104 are separated along cleave plane 108 from the remaining compositionally-graded buffer layers 104 that are bonded to handle substrate 110, and the resulting structure is inverted. In this embodiment, separation is accomplished via annealing (e.g., at approximately 650 degrees Celsius), where substrate 102 and III-V layer 104a are separated from III-V layers 104b-n that are bonded to handle substrate 110.

Figure 1E:
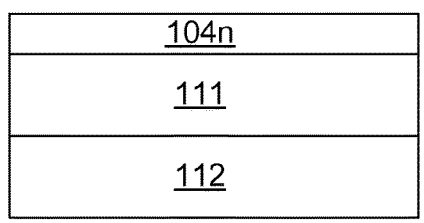

As shown in FIG. 1E, III-V layers 104b through 104n-1 are selectively removed (e.g., via wet etching) to expose III-V layer 104n. As discussed in greater detail with regard to FIGS. 2A-2F, in other embodiments, III-V layers need not be removed to this extent and etching techniques used do not need to be highly selective for a particular III-V layer.

Figure 1F:
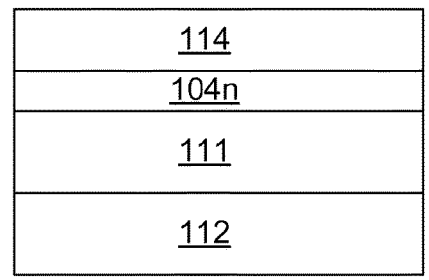

As shown in FIG. 1F, semi-insulating buffer layer 114 is grown upon III-V layer 104n. As previously discussed, in this embodiment, III-V layer 104n is comprised of a III-V alloy that has been selected to provide an optimal surface upon which to grow semi-insulating buffer layer 114. In this embodiment, semi-insulating buffer layer 114 comprises a III-V alloy having a band energy gap that is greater than that of III-V layer 104n. For example, semi-insulating buffer layer 114 may be a III-V alloy comprised of In(0.52)Al(0.48)As. Semi-insulating buffer layer 114 can be grown using any suitable epitaxial growth and/or deposition techniques known in the art.

As shown in FIG. 1G, channel layer 116 is grown upon semi-insulating buffer layer 114. In this embodiment, channel layer 116 also comprises a III-V alloy and may be pseudomorphic or lattice-matched. In other embodiments, semi-insulating buffer layer 114 can be omitted and channel layer 116 can be grown directly upon III-V layer 104n, where channel layer 116 comprises a III-V alloy having a band energy gap that is less than that of III-V layer 104n. Channel layer 116 can be grown, as a single layer directly atop and distinct from the semi-insulating buffer layer 114, as shown in FIG. 1G, using any suitable epitaxial growth and/or deposition techniques known in the art.

Growing channel layer 116 upon semi-insulating buffer layer 114 yields IIIVOI platform 100 upon which various semiconductor devices can be built. Such platforms may also be referred to as extremely thin III-V-on-insulator (ETIIIVOI) platforms. The thickness of channel layer 116 can be varied based upon the intended semiconductor device to be built. For example, in this embodiment, a thinner channel layer 116 (e.g., greater than or equal to 3 nm and less than or equal to 20 nm) may be grown for building a planar III-V FET, as shown in FIG. 1H. In another embodiment, a thicker channel layer 216 (e.g., greater than or equal to 30 nm and less than or equal to 50 nm) may be grown to fabricate fins 218 for a III-V FinFET, as discussed in greater detail with regard to FIGS. 2E and 2F.

FIG. 1H depicts a phase of fabrication in which a planar FET structure is built upon IIIVOI platform 100, in accordance with an embodiment of the present invention. In this embodiment, the planar FET structure includes source region 118, drain region 120, gate stack 122, and back gate access regions 124. Gate stack 122 is a structure used to control output current (i.e., flow of charge carriers) through a channel in channel layer 116 between source region 118 and drain region 120. Source region 118 is a doped region from which majority charge carriers flow, and drain region 120 is a doped region located at the end of the channel to which the charge carriers flow. In an alternative embodiment, source region 118 and drain region 120 may be "raised" source/drain regions, wherein a portion of the respective source/drain region is formed through epitaxial growth of semiconductor material embedded in channel layer 116. The respective source/drain regions can then rise out of channel layer 116, while another portion of the respective source/drain regions resides within channel layer 116. Back gate access regions 124 (e.g., vias) permit the application of voltage to III-V layer 104n (i.e., which can be doped ++p or ++n) to serve as a second gate for adjusting the threshold voltage differential needed to create a conducting channel in channel layer 116 between source region 118 and drain region 120.

Figure 2A:
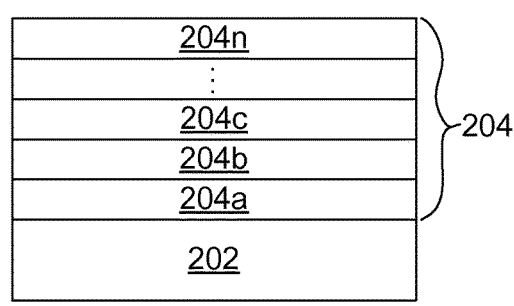
FIGS. 2A through 2E depict phases of fabrication of a IIIVOI platform, in accordance with an embodiment of the present invention.
Figure 2B:
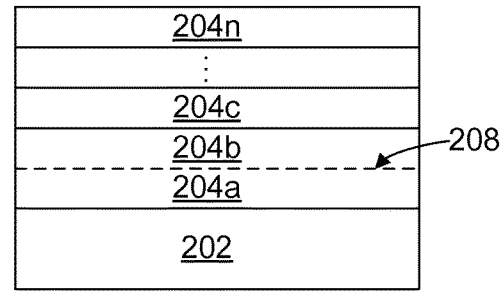
Figure 2C:
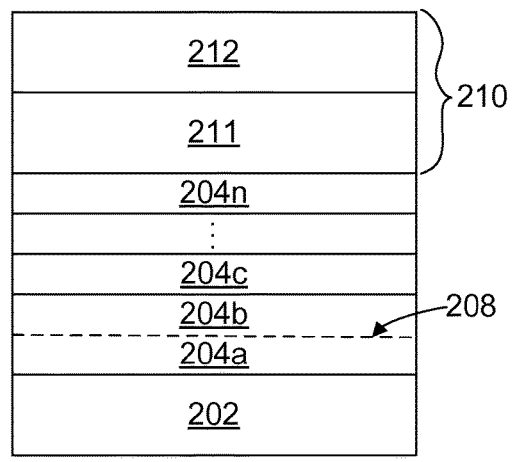
Figure 2D:
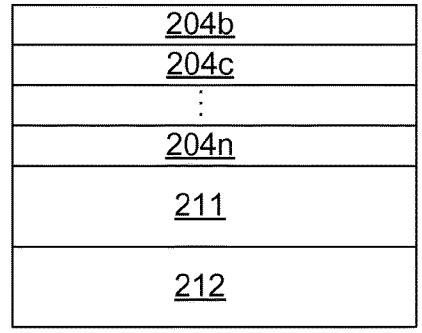
Figure 2E:
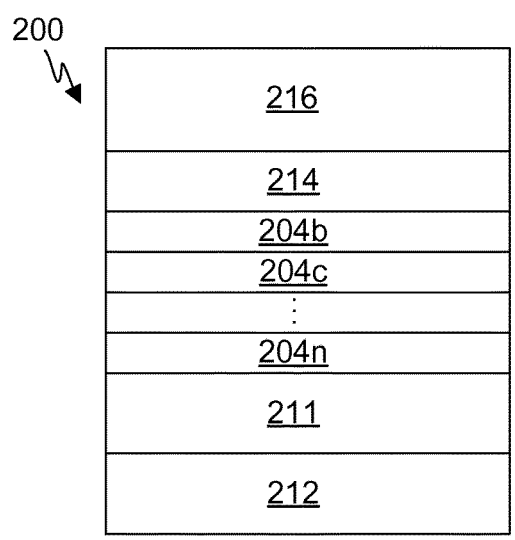
Figure 2F:
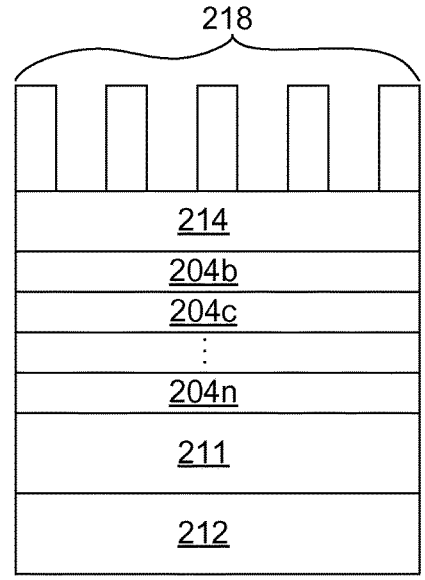
FIG. 2F depicts a phase of fabrication in which fins are formed on the IIIVOI platform of FIG. 2E, in accordance with an embodiment of the present invention.

FIGS. 2A through 2E depict phases of fabrication of IIIVOI platform 200 (shown in FIG. 2E), in accordance with an embodiment of the present invention. In this embodiment, IIIVOI platform 200 and the phases of fabrication depicted in FIGS. 2A through 2D are similar to the IIIVOI platform 100, and the phases of fabrication depicted in FIGS. 1A through 1D, where like elements have reference numerals increased by a factor of 100 and, therefore, will not be separately discussed again. Unlike the fabrication of IIIVOI 100, however, IIIVOI platform 200 is fabricated without selectively etching down to III-V layer 204n. Instead, as shown in FIG. 2E, semi-insulating buffer layer 214 is grown on III-V layer 204b. Furthermore, as shown in FIG. 2E, a thicker channel layer 216 is grown upon semi-insulating buffer layer 214 to yield IIIVOI platform 200 upon which a FinFET or other 3-dimensional semiconductor device can be fabricated. FIG. 2F depicts a phase of fabrication in which fins 218 for a FinFET are formed in channel layer 216 of IIIVOI platform 200, in accordance with an embodiment of the present invention. For illustrative purposes, other components of a completed FinFET are not shown.

Accordingly, embodiments of the present invention provide IIIVOI platforms and methods for fabricating the same that leverage smart cut techniques to transfer compositionally-graded III-V layers to a handle substrate (e.g., a silicon wafer having an insulator layer), upon which a semi-insulating buffer layer and channel layer can be grown. In addition to the planar FET and FinFET structures discussed above, various other FET structures (e.g., trench FETs, vertical FETs, gate-all-around FETs) and/or other semiconductor devices can be built upon IIIVOI platforms fabricated, in accordance with embodiments of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A III-V-on-insulator (IIIVOI) platform for a semiconductor device, comprising:
   a plurality of compositionally-graded III-V buffer layers bonded to a top surface of an insulator layer formed on a semiconductor substrate;
   a semi-insulating buffer layer grown on a top surface of the plurality of compositionally-graded III-V buffer layers; and
   a channel layer grown on the semi-insulating buffer layer, wherein the channel layer is a single layer directly atop and distinct from the semi-insulating buffer layer.

2. The IIIVOI platform of claim 1, wherein the insulator layer comprises an oxide.

3. The IIIVOI platform of claim 1, wherein the plurality of compositionally-graded III-V buffer layers comprise one or more of an indium gallium antimonide (InGaSb) alloy, an indium aluminum antimonide (InAlSb) alloy, and an aluminum gallium nitride (AlGaN) alloy.

4. The IIIVOI platform of claim 1, wherein the plurality of compositionally-graded III-V buffer layers have bond lengths that increase from a III-V buffer layer immediately adjacent to the substrate to a III-V buffer layer immediately adjacent to the semi-insulating buffer layer.

5. The IIIVOI platform of claim 4, wherein the plurality of compositionally-graded III-V buffer layers comprise indium gallium arsenide (InGaAs) alloys that increase in concentration of gallium (Ga) and decrease in concentration of indium (In) from the III-V buffer layer immediately adjacent to the substrate to the III-V buffer layer immediately adjacent to the semi-insulating buffer layer.

6. The IIIVOI platform of claim 4, wherein the plurality of compositionally-graded III-V buffer layers comprise one or more of an indium gallium antimonide (InGaSb) alloy, an indium aluminum antimonide (InAlSb) alloy, and an aluminum gallium nitride (AlGaN) alloy.

7. The IIIVOI platform of claim 4, wherein the composition of the III-V buffer layer immediately adjacent to the semi-insulating buffer layer has a band energy gap that is less than that of the semi-insulating buffer layer.

8. The IIIVOI platform of claim 7, wherein the composition of that layer of the compositionally-graded III-V buffer layer on which the semi-insulating buffer layer is grown that is nearest to the substrate is p++ doped or n++ doped, such that such furthest layer is a conductor that enables control of electrical behavior of the channel layer.

9. The IIIVOI platform of claim 8, further comprising a gate stack built atop the channel layer, wherein the gate stack comprises a double-gated transistor.

10. The IIIVOI platform of claim 1, further comprising one or more fins are formed in the channel layer.

11. A III-V-on-insulator (IIIVOI) platform for a semiconductor device, comprising:
    a III-V buffer layer bonded to an oxide layer disposed on a top surface of semiconductor wafer; and
    a channel layer grown on a top surface of the III-V buffer layer.

12. The IIIVOI platform of claim 11, wherein the III-V buffer layer comprises one or more of an indium gallium antimonide (InGaSb) alloy, an indium aluminum antimonide (InAlSb) alloy, and an aluminum gallium nitride (AlGaN) alloy.

13. A semiconductor structure, comprising:
    one or more compositionally-graded III-V buffer layers comprising a first surface and a second surface;
    a first substrate bonded to said first surface;
    a second substrate bonded to said second surface;
    said second substrate comprising a silicon wafer having an oxide layer;
    said oxide layer comprising said second surface;

a cleave plane disposed within said one or more compositionally-graded III-V buffer layers; and
said cleave plane comprising implanted ions.

\* \* \* \* \*